United States Patent [19]

Staros

[11] Patent Number: 5,708,850
[45] Date of Patent: Jan. 13, 1998

[54] PARALLEL PROCESSING SYSTEM FOR TIME DIVISION MULTIPLEX DATA TRANSFER INCLUDING READ/WRITE DUAL PORT MEMORY ACCESSIBLE TO BUS AND DIGITAL SIGNAL PROCESSOR DURING OPPOSITE PHASES OF CLOCK

[75] Inventor: Theodore Staros, Margate, Fla.

[73] Assignees: Sony Corporation, Japan; Sony Electronics Inc.

[21] Appl. No.: 280,983

[22] Filed: Jul. 27, 1994

[51] Int. Cl.⁶ .............................. G06F 15/16; G06F 9/38
[52] U.S. Cl. .................... 395/868; 395/297; 395/304; 395/458; 395/476
[58] Field of Search ............................ 395/821, 868, 395/871, 840, 297, 865, 550, 476, 479, 458, 304, 420

[56] References Cited

U.S. PATENT DOCUMENTS

| | | | |
|---|---|---|---|
| 4,028,663 | 6/1977 | Royer et al. | 340/172.5 |
| 4,121,285 | 10/1978 | Chen | 364/200 |
| 4,145,735 | 3/1979 | Soga | 364/200 |
| 4,395,765 | 7/1983 | Moffitt et al. | 365/174 |
| 4,443,848 | 4/1984 | Gehman | 364/200 |
| 4,591,975 | 5/1986 | Wade et al. | 364/200 |
| 4,907,070 | 3/1990 | Wesolowski | 358/17 |
| 5,146,607 | 9/1992 | Sood et al. | 395/800 |
| 5,359,564 | 10/1994 | Liu et al. | 365/49 |
| 5,428,810 | 6/1995 | Barkans et al. | 395/800 |
| 5,475,858 | 12/1995 | Gupta et al. | 395/800 |
| 5,550,898 | 8/1996 | Abbasi et al. | 379/59 |

OTHER PUBLICATIONS

"Pipelined, Time-Sharing Access Technique for a Highly Integrated Multiport Memory", Matsumura et al, IEEE, pp. 107-108, Feb. 1990.

Primary Examiner—Thomas C. Lee
Assistant Examiner—Rehana Perveen Krick
Attorney, Agent, or Firm—Ronald P. Kananen

[57] ABSTRACT

Disclosed is a multiprocessor system made up of several processing nodes linked by a time division multiplexed (TDM) bus to form a synchronous system. According to one embodiment, each processing node includes a digital signal processing (DSP) element, a dual port memory element and a memory control element in an integrated structure. Each memory element is segmented into four quarters. The first two are for read operations by the DSP element and write operations by the bus. However, the DSP element and the bus can only access any given segment during opposite phases of a frame clock signal. Additionally, each node is assigned an exclusive identification code whereby each node can post data to a memory element of another node.

According to another embodiment, the various elements of each node are combined in various integrated structures.

13 Claims, 8 Drawing Sheets

PARALLEL PROCESSING SYSTEM FOR TIME DIVISION MULTIPLEX DATA TRANSFER INCLUDING READ/WRITE DUAL PORT MEMORY ACCESSIBLE TO BUS AND DIGITAL SIGNAL PROCESSOR DURING OPPOSITE PHASES OF CLOCK

FIELD OF THE INVENTION

This invention relates to a processing system which includes several processing nodes operatively coupled to a time division multiplexed bus. More specifically, it relates to digital signal processing utilizing nodes comprising a processing element, a dual port memory element, and a dual port memory control element.

BACKGROUND OF THE INVENTION

It is known to use distributed processing systems utilizing several processing elements in order to improve processing power, and thus system performance. Such multiprocessor systems may each include several Digital Signal Processing (DSP) applications. For example, the system may comprise several processing nodes, each including a separate processor. The processors communicate among each other by exchanging data according to various techniques known in the art. These methods include various serial communication techniques, first-in first-out (FIFO) buffering, and conventional time-division multiplexed (TDM) busing.

When properly coupled together, such multiprocessor systems enable large computational tasks to be run simultaneously for faster application time-to-completion. However, there are limits on the performance which is achievable. For example, there is a limit on the gain in system performance provided by the addition of extra processing elements in a system. This limit arises because as additional processors are added, there is an increase in the amount of data being communicated among the nodes. While bus structures between the nodes can be set to operate at higher speed in an attempt to accommodate such an increase in data, the maximum speed is limited by the physical characteristics of the data transmission medium.

SUMMARY OF THE INVENTION

It is an object of this invention to provide a high performance multiprocessor system which utilizes TDM busing for high-speed data transfer among several dual port memory elements. It is a further object of the invention to provide a multiprocessor system in which integrated structures are used in each processing node.

Directed to achieving these objects, there is described a multiprocessor system made up of several processing nodes linked by a time division multiplexed (TDM) bus to form a synchronous system. According to one embodiment, each processing node includes a digital signal processing (DSP) element, a dual port memory element and a memory control element in an integrated structure. Each memory element is segmented into four quarters. The first two are for read operations by the DSP element and write operations by the bus. However, the DSP element and the bus can only access any given segment during opposite phases of a frame clock signal, whereby potential addressing conflicts are avoided.

According to one aspect of the invention, each node is assigned an exclusive identification code whereby each node can post data to a memory element of another node.

According to another aspect of the invention, each dual port memory control element is subdivided into quarter segments, a first two of which are accessible for read operations by the digital signal processor of the same node and for write operations by the bus, and a second two of which are accessible for write operations by the digital signal processor of the same node and for read operations by the bus.

According to still another aspect of the invention, the various elements of each node are combined in various integrated structures. In one variation of this aspect, each digital signal processing element is directly coupled to a plurality of dual port memories, each controlled by a dual port memory control element and each linked to a separate time division multiplex bus.

DETAILED DESCRIPTION OF THE PREFERRED EMBODIMENTS

Hereinafter the present invention will be described in detail with reference to the accompanying drawings which represent preferred embodiments of the invention.

Figure 1:
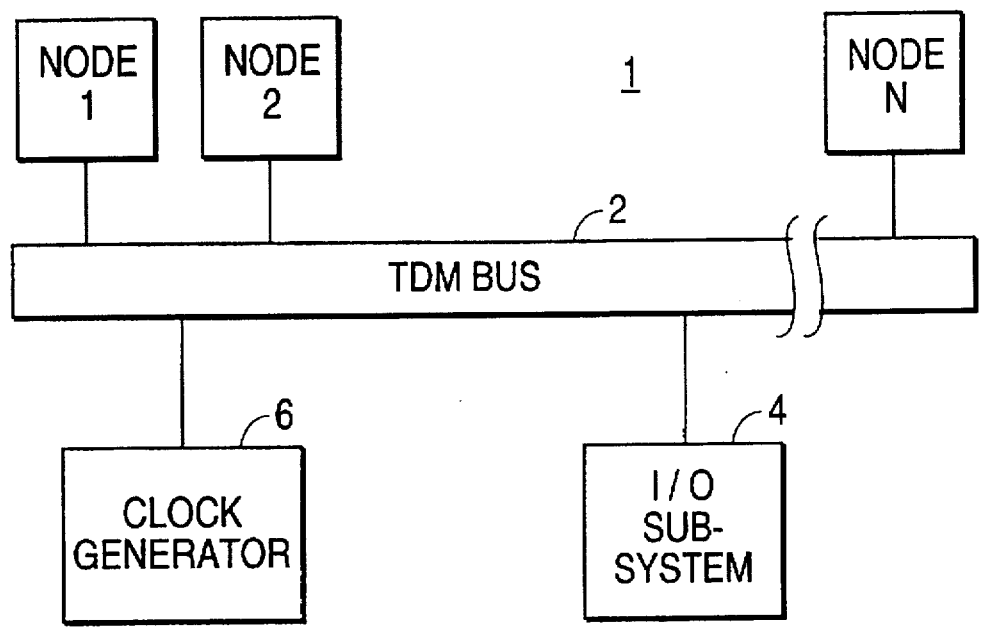
FIG. 1 is a block diagram showing a distributed multiprocessor system.

FIG. 1 illustrates a distributed processing system 1 in which a plurality of processing nodes 1 to n are operatively coupled with a time division multiplexed (TDM) bus 2 in order to achieve high speed data transfer. The system further includes an input/output (I/O) subsystem 4 through which processes may be input to the system. It also includes clock signal generation circuitry 6 by which each node may be synchronously coupled.

With such a system, a process to be performed is divided into subprocesses which are allocated to each processing node. After the processing is completed, the results are output through I/O subsystems.

Figure 2:
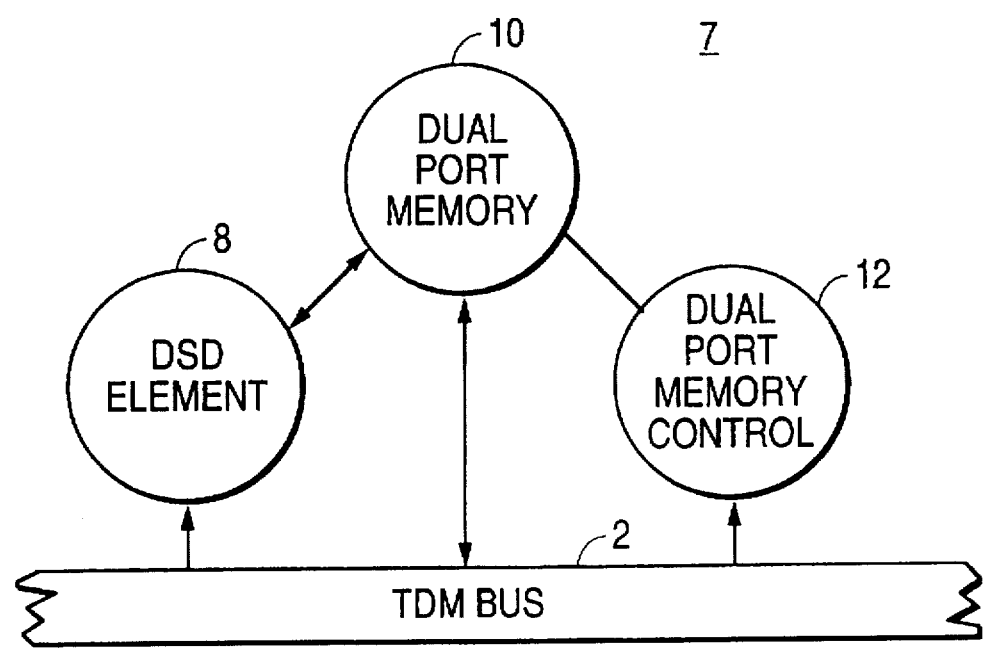
FIG. 2 is a block diagram showing an individual processing node according to the present invention.

According to one aspect of the invention, each node of the system includes three elements. As illustrated in FIG. 2, each node 7 has a processing element 8 (a DSP element) for providing digital signal processing of digital signals. The DSP element 8 is coupled to a dual port memory element 10. In turn, the dual port memory element 10 is coupled to a dual port control element 12. Each of these three elements are coupled to the TDM bus 2.

Figure 3A:
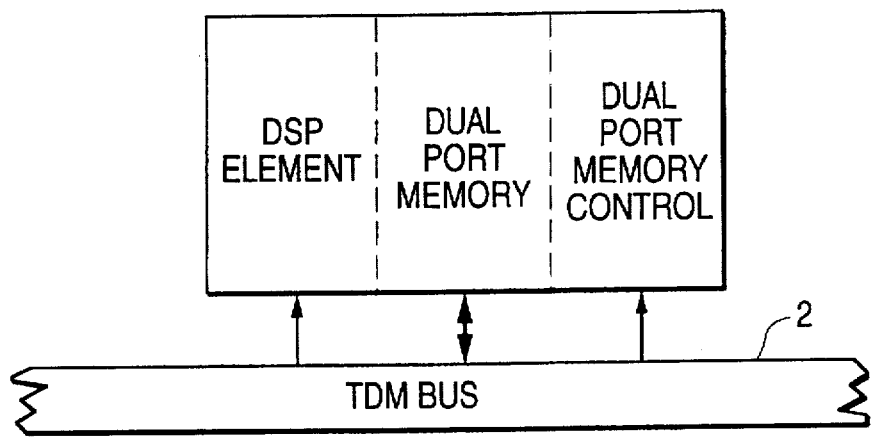
FIGS. 3A to 3F show individual processing nodes comprising various integrated structures according to the present invention.
Figure 3B:
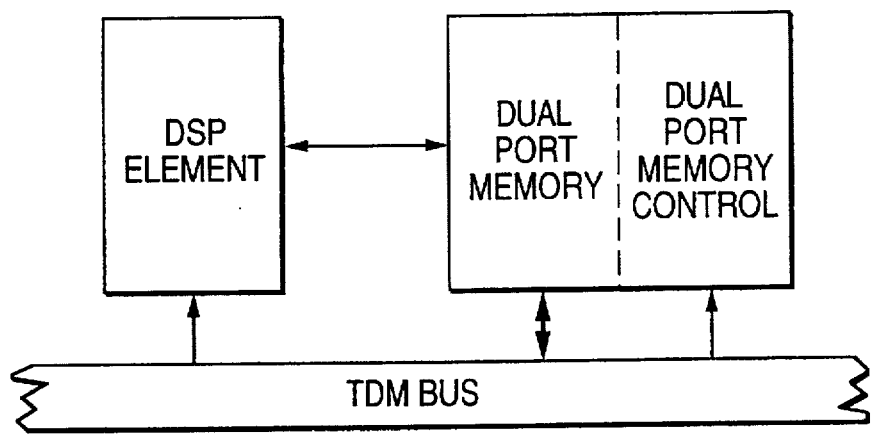
Figure 3C:
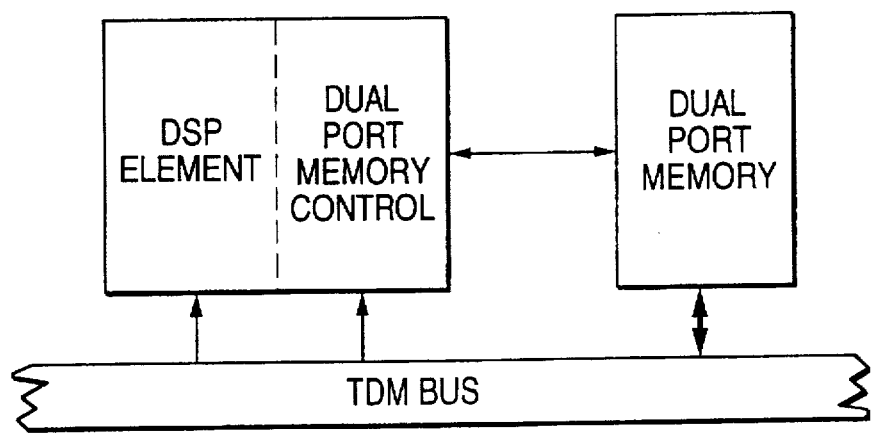
Figure 3D:
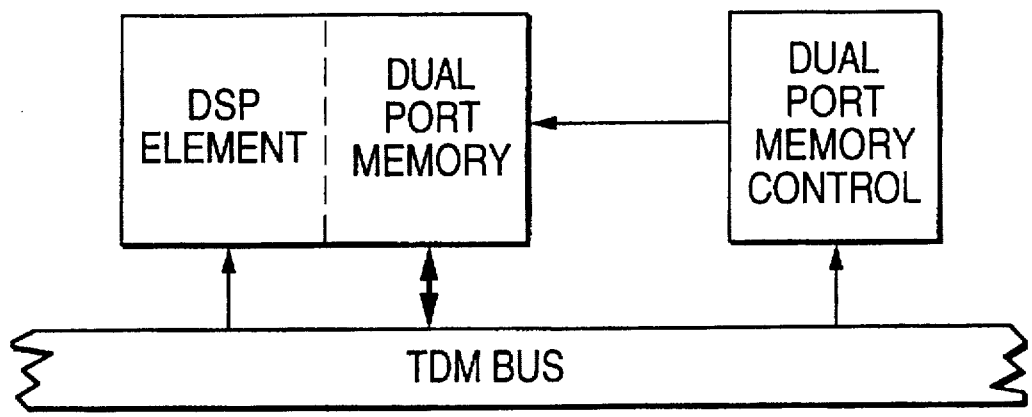
Figure 3E:
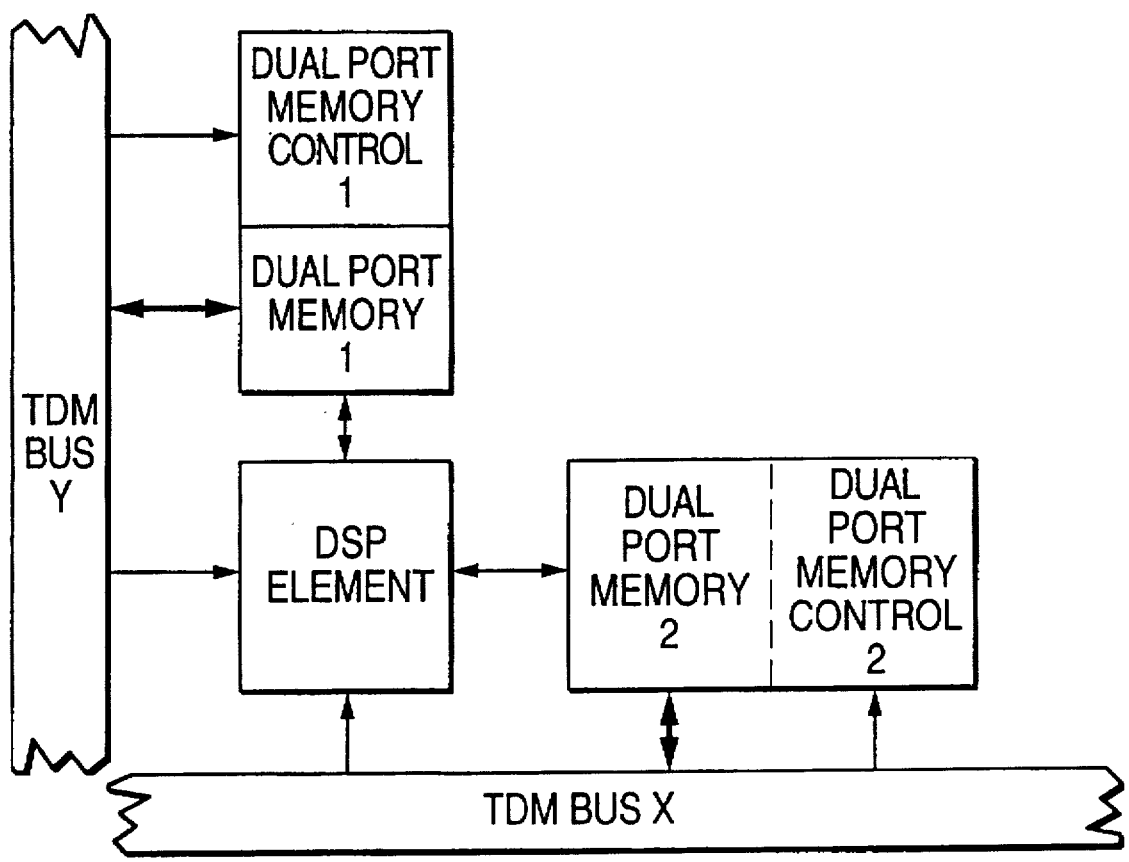
Figure 3F:
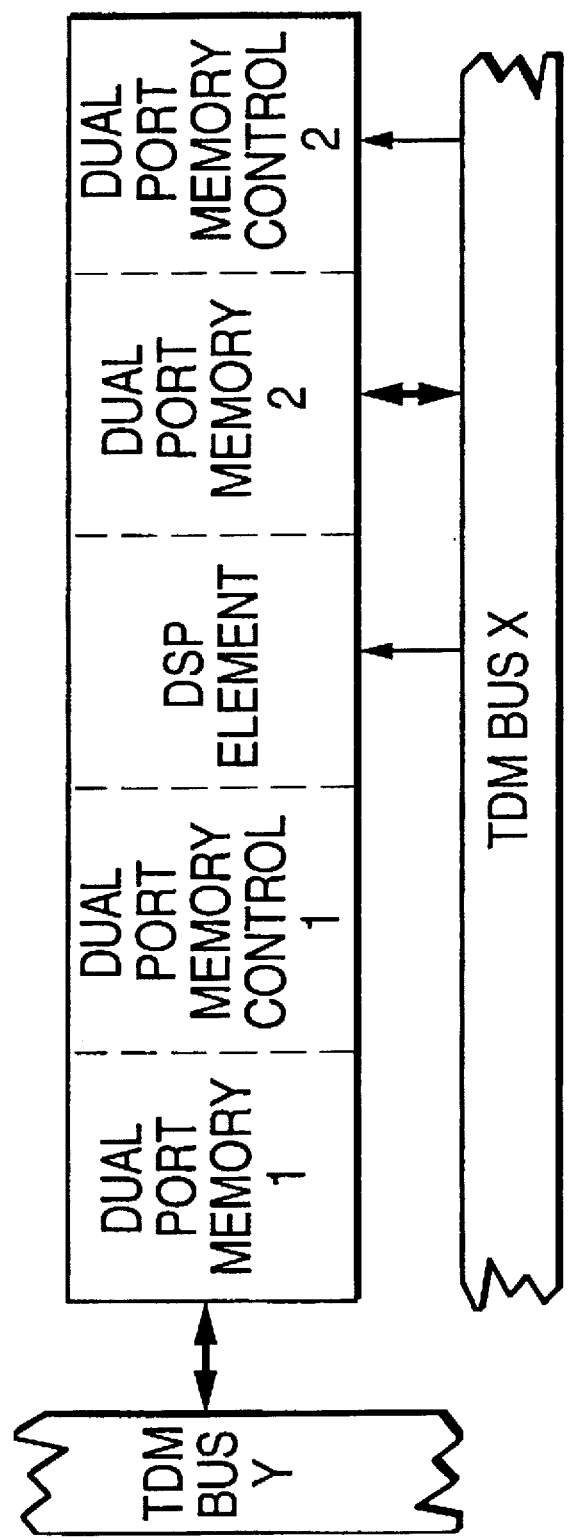

It is a preferred feature of this invention that two or more of these three elements are arranged together in an integrated structure, as illustrated in FIGS. 3A to 3F. That is, the integrated structure comprises one of the following structures: (1) a processing element integrated with a dual port control element and a dual port memory element (FIG. 3A); (2) a dual port memory element integrated with a dual port control element (FIG. 3B); (3) a dual port control element integrated with a processing element (FIG. 3C); (4) a dual port memory element integrated with a processing element (FIG. 3D); (5) a processing element used with multiple sets of integrated structures consisting of integrated structure (2) (FIG. 3E); and (6) a processing element integrated with multiple sets of dual port memory elements and dual port control elements (FIG. 3F).

This invention, through the above listed integrated structures (5) and (6), permit the use of multiple TDM bussings per processing element. This allows busing across multiple axes or dimensions. For example, as shown in FIGS. 3E and 3F, there are two TDM buses, TDM BUS X and TDM BUS Y. In this way, multi-dimensional arrays of processing nodes can be interconnected. Such multi-dimensional structures can be implemented in view of the description set forth below.

Integration may be achieved in many ways known in the art. For example, custom chips may be fabricated which embody any of the integrated structures shown with dashed lines in FIGS. 3A to 3F. Alternatively, these integrated structures may be made with compiled gate arrays. Other techniques for integration include multi-chip modules and SIPP or SIMM packages.

Figure 4:
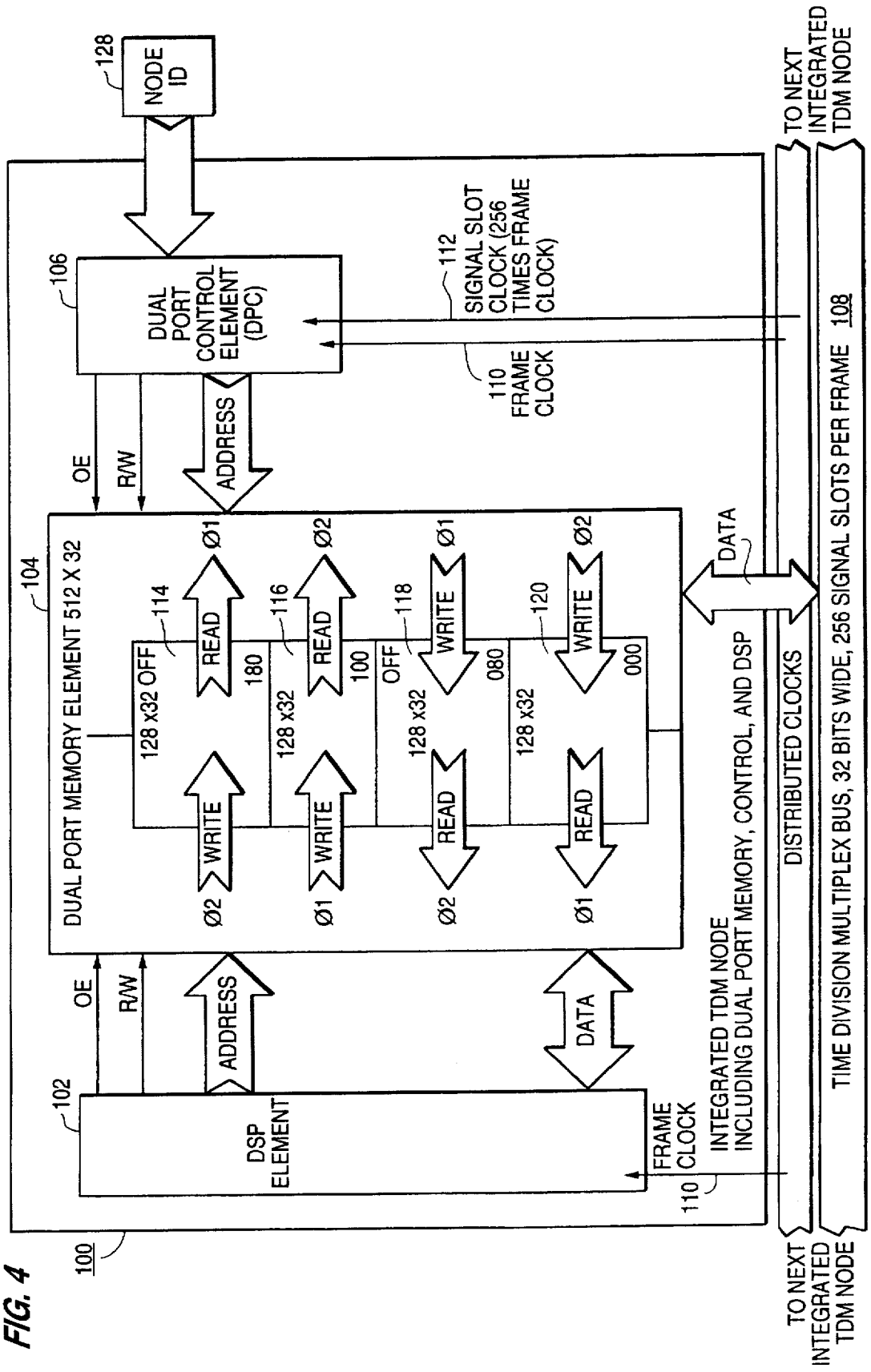
FIG. 4 is a more detailed representation of an integrated processing node according to the present invention.

FIG. 4 is a more detailed example of an embodiment of the invention in which a single integrated structure 100 includes the DSP element 102, the dual port memory element 104 and the dual port control element 106, as mentioned above in reference to FIG. 3A. In this embodiment, a TDM bus 108 is used which is 32 bits wide, with 256 signal slots per processing cycle. This TDM bus is coupled to eight processing nodes (not shown) forming a distributed array in which each node is permitted to post data to the TDM bus. Since there are eight nodes and 256 signal slots, this example allows each node to post a maximum of 32 signals (one word) to the TDM bus per frame.

While this embodiment is discussed with reference to eight nodes, this number is merely illustrative. It will be appreciated by those skilled in the art that fewer or more nodes could be used without departing from the scope of the invention.

As shown, the DSP element 102 and the dual port memory control element 104 are synchronized by a frame clock signal 110 which is generated by a technique known in the art. Further, the dual port memory control element 106 is indexed by a signal slot clock 112 which runs at a rate that is 256 times that of the frame clock. Consequently, a time divided multiplexed system is provided in which 256 signals (discrete data elements) may be transferred per frame period.

As shown, the dual port memory element 104 is coupled to both the DSP element 102 and to the TDM bus 108. The dual port control element controls the data which is posted to the TDM bus from the dual port memory element. In the example shown, the dual port memory element is organized by 512 memory address locations, each holding one thirty-two bit word. Again, the size of the memory element may vary without departing from the scope of the invention.

The dual port structure of the memory element presents a potential problem in that either port may seek access to the same dual port memory address. That is, there is the potential that both the TDM bus and the DSP element will seek to write to the same address location in the memory element. In the system according to the invention, the bus 108 must always have priority, and therefore there is no mechanism by which the bus 108 may wait. Consequently, this potential problem cannot be effectively avoided with a first in time response.

It is a feature of the invention that this problem is avoided by use of memory segmentation. That is, according to this example, the continuous address length of the dual port memory is logically segmented into four equal quarters 114, 116, 118, 120 each 128 words in length. Each quarter of the memory element is accessed in a manner which prohibits a simultaneous access for the same address by either port. More specifically, dual port memory accessing is limited by two restrictions: (1) the phase of the frame clock and (2) the occurrence of a read or write signal (R/W). The manner by which these restrictions are implemented is explained in detail below.

DSP Interaction With Dual Port Memory

In the example shown in FIG. 4, the DSP 102 may interact with the dual port memory element 104 by performing a read and/or a write operation in a frame. That is, the DSP may read data from the dual port memory element or write data thereto according to a read/write (R/W) signal sent to the memory element. However, in order to avoid address conflicts with the bus, such operations are restricted by the phase of the frame clock signal 110 which determines the segment of the dual port memory element 104 that is available to the DSP. That is, the address data from the DSP element to the memory element depends on the phase of the frame clock 110. This scheme permits each DSP to either read or write to any address location of a corresponding dual port memory element (one within the same node) in any order.

More specifically, each DSP may read data from address locations within quarter segments 118, 120 of the dual port control element depending on the phase of the frame clock. In the example show, the first 128 address locations (addresses 000h to 07Fh) may be read during phase 1 of the frame clock 110. The second 128 address locations (080h through 0FFh) may be read during phase 2 of the frame clock 110. Thus, the DSP element may read any address location within the first half 118 and 120 of the memory element 104 in any order so long as the phase restriction is met.

As shown in FIG. 4, data is written from the TDM bus 108 to the first half of the memory element 118 and 120 in the opposite manner. That is, while during phase 1 of the frame clock, the DSP element 102 reads data from the first quarter segment 120 of the memory element 104, the TDM bus 108 writes data only to the second quarter segment 118 of the memory element 104. During phase 2, the TDM bus 108 then writes data within the first quarter segment 120 while the DSP element reads from the second quarter segment 118. In this way, potential conflicts between the DSPs and the TDM bus are avoided.

Similarly, the DSP element 102 may write to the appropriate quarter segment of the dual port memory element according to the phase of the frame clock. For example, as shown, the DSP element 102 may only write to any address in the third quarter segment (addresses 100h to 17Fh) of the dual control memory element 104 during phase 1. During phase 2, the DSP may write to any address in the last quarter segment (addresses 180h through 1FFh).

Again, conflict with the TDM bus is avoided since the TDM bus reads data from the last two quarter segments 114 and 116 of the memory element 104 in the opposite order as the DSP element writes data. Specifically, as the DSP writes during phase 1 in the third quarter segment 116 of the memory, the TDM bus reads data from only the fourth quarter segment 114. During phase 2, the DSP element may write to an address in the fourth quarter segment 114, while the TDM bus receives data from the third quarter segment 116.

In this way, each DSP may write to any address location within the specified quarter segments of the memory. However, only a portion of the quarter segments are available for posting to the TDM bus. This restriction enables each of the DSPs to share data via the TDM bus.

More specifically, it is a feature of the invention that each node is assigned a unique identification number 128. This permits the sharing of the bus structure among several nodes without interference thereamong.

In the particular example discussed herein, there are eight integrated elements (processing nodes) per TDM bus structure. Accordingly, each node is assigned an exclusive identification from 0 to 7. When writing to a dual port memory element, each node is allocated a specified address range as shown in Table A. For example, processing node 0's processor should only write to the first sixteen address locations in each of the upper two quarter segments (ranging from 100h to 10Fh and 180h to 18Fh). Processing node 1's processor should only write to the second sixteen address locations in each of the upper two quarter segments (ranging from 110h to 11Fh and 190h to 19Fh). The remaining six processing nodes are restricted in a similar fashion. Only these addresses will be subsequently posted to the bus. Writing to locations other than these node specific allocations, will have no useful effect.

TABLE A

| Node Number | Lower Write Address, Phase 1 | Upper Write Address, Phase 1 | Lower Write Address, Phase 2 | Upper Write Address, Phase 2 |
| --- | --- | --- | --- | --- |
| 0 | 100h | 10Fh | 180h | 18Fh |
| 1 | 110h | 11Fh | 190h | 19Fh |
| 2 | 120h | 12Fh | 1A0h | 1AFh |
| 3 | 130h | 13Fh | 1B0h | 1BFh |
| 4 | 140h | 14Fh | 1C0h | 1CFh |
| 5 | 150h | 15Fh | 1D0h | 1DFh |
| 6 | 160h | 16Fh | 1E0h | 1EFh |
| 7 | 170h | 17Fh | 1F0h | 1FFh |

Dual Port Control Interaction with Dual Port Memory

By use of the dual port control element shown, it is possible for the TDM bus to perform both write operations (capture of data from the TDM bus) and read operations (posting of data to the TDM bus) with each of the dual port memory elements. For example, the dual port control element accomplishes write operations by sequentially addressing the dual port memory according to the sequence described above, writing data from the TDM bus to the first two quarter segments of each dual port memory element. That is, during phase 1 of the frame clock, the TDM bus 108 writes data to the second quarter segment 118 of the memory element 104, then during phase 2 writes data to the first quarter segment 120 of each memory element.

Read operations are similarly accomplished depending on the phase of the frame clock. That is, during phase 1, the fourth quarter segment 114 of the memory element 104 is read. During phase 2, the third quarter segment 116 is read. However, as mentioned above, the posting of data to the TDM bus 108 is also dependent on the node identification number.

More particularly, depending on the predetermined node identification number, an address is selected in the upper half of the memory from which data is posted to the bus. Again, the particular addresses for this example are shown in Table A. These addresses contain the data specifically allocated for each node to post to the bus. The control element ensures this allocation by controlling the dual port memory's output enable (OE), setting it high only during each node's specifically allocated signal slots.

Figure 5:
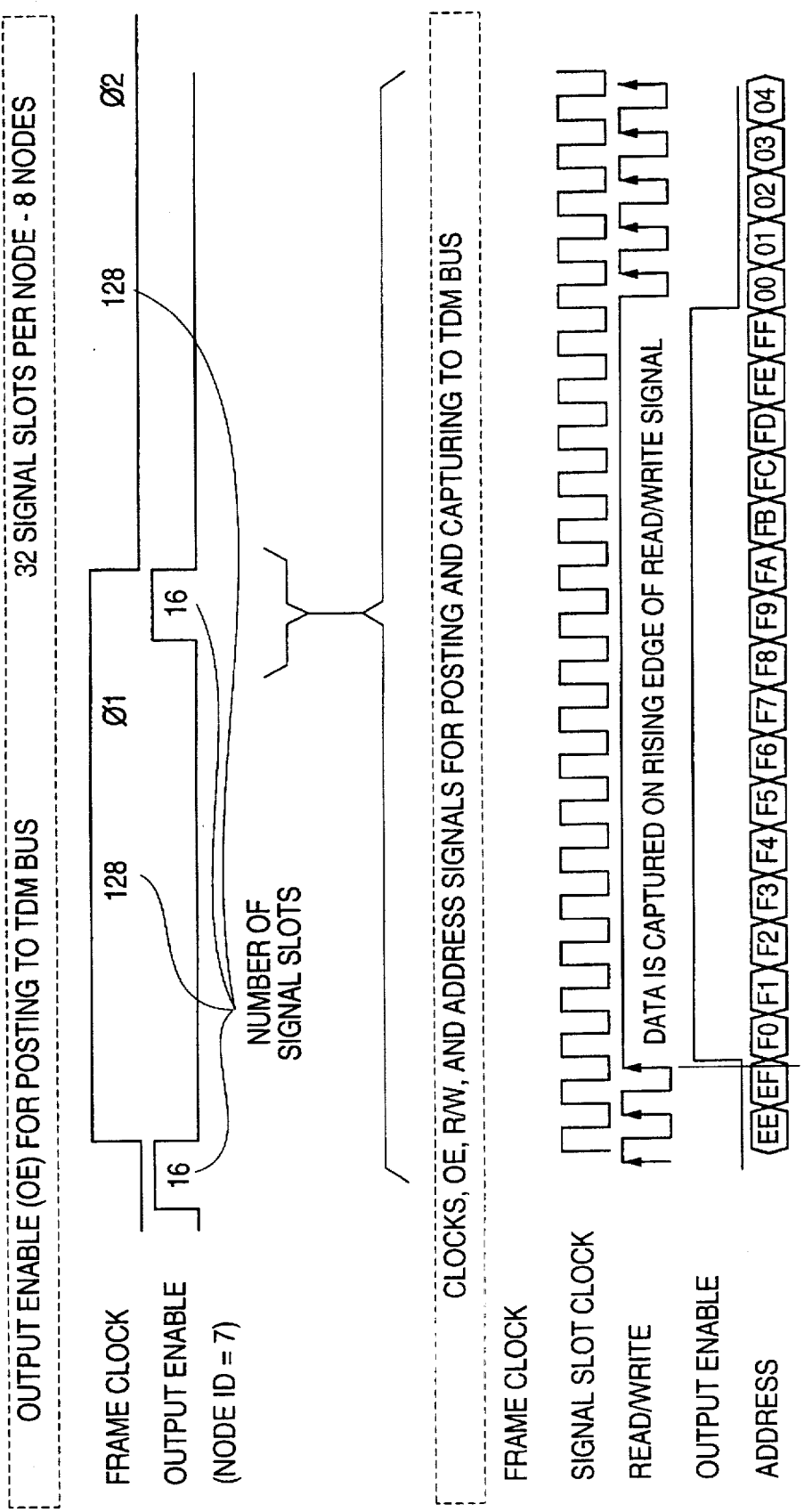
FIG. 5 is a timing diagram of the signals associated with the elements shown in FIG. 4.

FIG. 5 is a timing diagram for this example. As shown the frame clock signal operates over a full cycle in two phases $\phi_1$ and $\phi_2$. In the figure, the output enable for the last node, ID no. 7, is shown. The output enable signal for this node is held true only during the last sixteen of the 128 cycles which make up each phase of the frame signal.

The lower half of FIG. 5 illustrate the frame clock signal, signal clock signal, read/write signal (R/W), output enable (OE) signal, and address signals for reading a particular address segment. As shown, the OE signal is held true for addresses F0 to FF. Thus, data is captured from these addresses (read from the memory element) during this portion of the signal frame clock cycle.

Figure 6A:
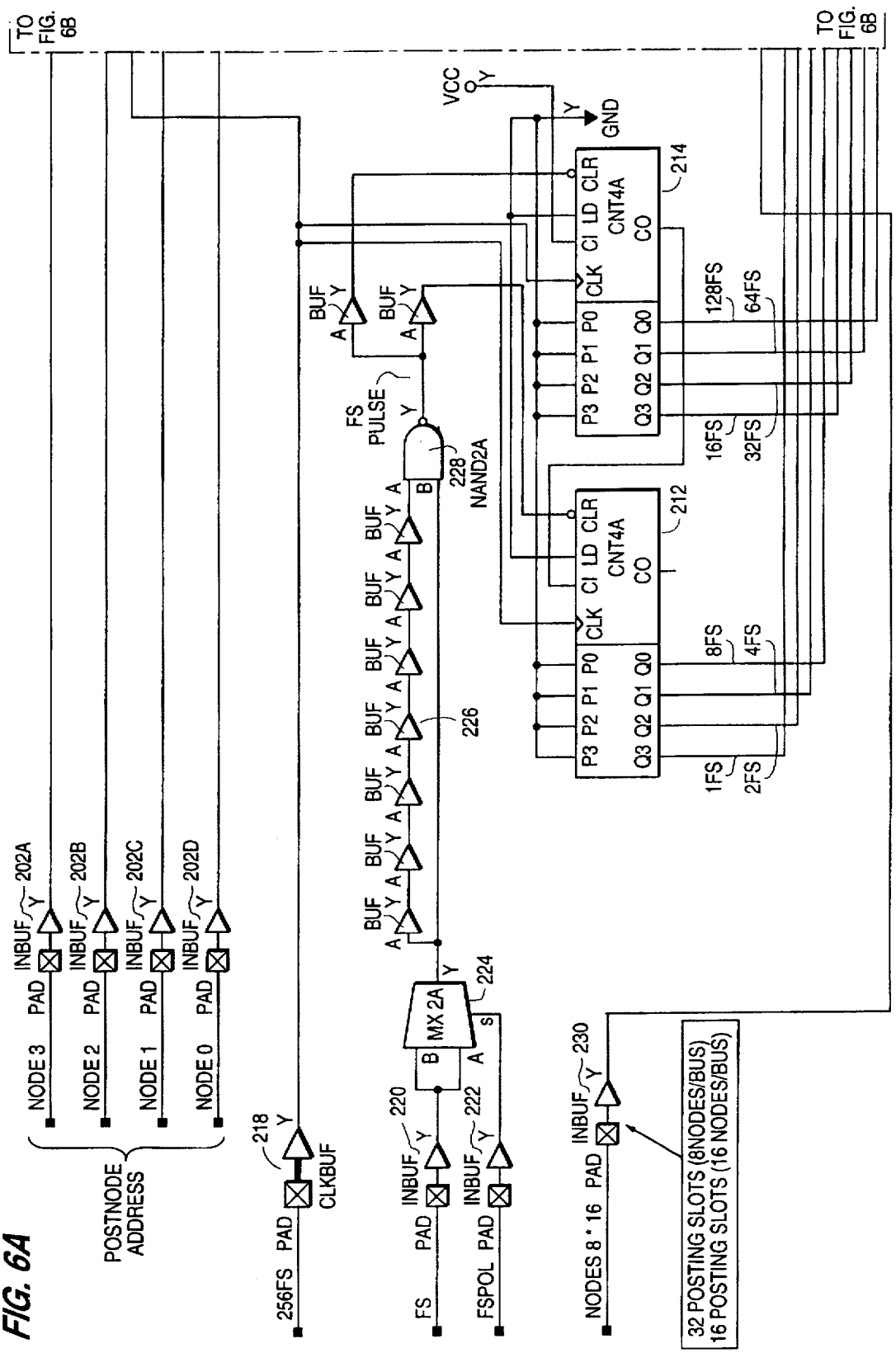
FIGS. 6A and 6B together are a schematic drawing of a more detailed embodiment of a dual port memory control element according to the invention.
Figure 6B:
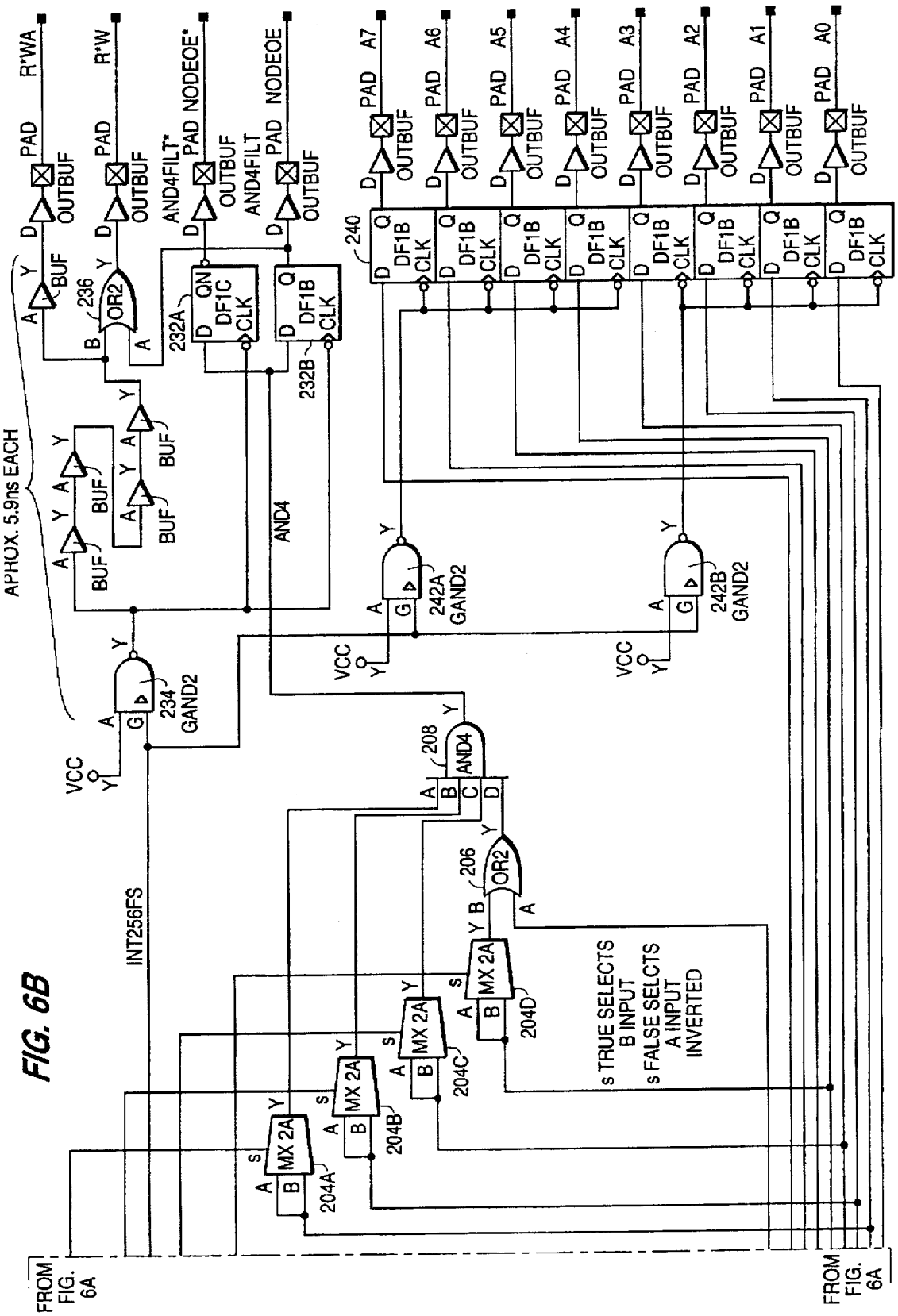

FIGS. 6A and 6B together form a schematic diagram illustrating a detailed embodiment of dual port control element circuitry by which the foregoing embodiment of the invention can be implemented. More particularly, this circuitry provides a detailed example of a decoding scheme by which the control circuit can determine which addresses of the corresponding memory element are read.

In this example, there are shown control inputs by which the node ID is input. These inputs are individually labelled NODE0 through NODE3, and are collectively labeled "postnode address". These are static inputs which define when the OE signal is true and the R/W clock is set high, during a given frame period.

As shown these signals from NODE 0 to NODE 3 are coupled through buffers 202A to 202D to control inputs of selector circuits 204A to 204D. In this way, the postnode address signals determine the output of the selector circuits 204A to 204B. Specifically, if the control input to one of the selector circuits is held high, the signal at input B is output from the selector circuit. If the control input is held low, the inverted A input is output from the selector circuit.

The A and B inputs of these selector circuits are coupled to two counter circuits 212 and 214 (CNT4A). As shown, these counter circuits are arranged such that the second counter circuit 214 cascades to the first 214. The clock input (CLK) to each of these counters 212 and 214 are coupled to the signal slot clock signal labelled 256FS via a buffer element 218.

These counters are coupled to a signal from a NAND gate 228. This gate has two inputs, inverted input A and input B which are both coupled to the output of a selector circuit 224. The inputs to the selector circuit 220 are coupled to the frame clock signal FS. Input A receives an inverted frame clock signal while input B receives a noninverted frame clock signal. The output of the selector circuit 224 is determined by the state of an input signal FSPOL which is coupled to the control input of the selector circuit 224. In this manner, the FSPOL signal determines whether a rising edge of the frame clock signal FS will initialize the count or a falling edge of the frame clock signal FS. That is, a true FSPOL signal selects the B input (rising edge), while a false FSPOL signal selects the A input (falling edge).

According to this arrangement, it can be seen that the frame clock signal is supplied to the counters 212 and 214 where it is divided into signals 1FS, 2FS, 4FS, 8FS, 16FS, 32FS, 64FS, and 128FS each having frequencies which are multiples of the frequency of the frame clock. The signals 2FS, 4FS, 8FS, and 16FS are each respectively coupled to the inputs of the selector circuits 204A, 204B, 204C, and 204D, which are controlled by the postnode address signals NODE0 to NODE3 as explained above. Each of the outputs of these selector circuits are coupled to a four input AND gate 208.

The output of the fourth selector circuit 204D of this group is provided to the four-input AND gate 208 via the first input A of a two input OR gate 206. The second input B of this OR gate 206 is coupled via a buffer element 230 to a control input NODE8*16. In this way, the number of nodes of the system can flexibly selected from either eight or sixteen depending on the state of the control signal. That is, if the NODE8*16 input is held high, the fourth input to the AND gate 208 remains high regardless of the output of the selector circuit 204D.

The output of the AND gate 208 is provided to the D inputs of flip flops 232A and 232B. The clock inputs of these flip flops are coupled to the frame slot clock via AND gate 234. It will be apparent that this arrangement provides an output enable signal, labelled NODEOE, which is coupled to the dual port memory element. The CLK input to the upper flip flop 232A is inverted, and thus provides an output enable signal NODEOE*.

Further shown, the output from the second flip flop 232B is provided to the first input A of an OR gate 236. The second input B of this OR gate 236 is coupled to the output of the AND gate 234. Thus, the output of the OR gate 236 provides a read/write control signal, labelled R W, to the dual port memory element. A second read/write signal R*WA is directly obtained from the AND gate 234 (and therefore independent of the postnode address signals). This signal may be used by any number of nodes on the TDM which are "listen" only.

Finally, the various signals 1FS, 2FS, 4FS, 8FS, 16FS, 32FS, 64FS, 128FS are each coupled respectively to an arrangement of flip flops 240. These circuits 240 are driven by the frame slot clock signal which is received via the AND gates 242A and 242B. The outputs of the flip flops are coupled to the address terminals, thereby providing eight address bits A7 to A0 (MSB through LSB). In this way, the memory control circuit sequentially accesses the dual port memory locations.

It will be apparent from this description that the dual port control element according to this embodiment ensures access to selected addresses of the dual port memory according to the state of both a read/write signal and a output enable signal. In this way, the control of the dual port memory according to the embodiments of FIGS. 4 and 5 is achieved.

It is also apparent that the foregoing system enables control of different numbers of processing nodes. Specifically, the detailed example provides a flexible means of easily selecting between eight and sixteen nodes.

The foregoing is a detailed description of the preferred embodiments. The scope of the invention, however, is not so limited. Various alternatives will be readily apparent to one of ordinary skill in the art. The invention is only limited by the claims appended hereto.

What is claimed is:

1. A multiprocessor system comprising:
    a time division multiplexed bus for transferring digital data at intervals determined by a clock signal, and
    a plurality of processing nodes operatively connected to each other with said bus to form a synchronous network, each of said processing nodes including a digital signal processing element, a read/write dual port memory element and a dual port memory control element;
    wherein each said processing node is assigned a unique identification code, said identification code determining an exclusive range of address locations of each said dual port memory elements which are available for each said processing node;
    wherein each said dual port memory element has a first port for exchanging data with a corresponding digital signal processing element of the same processing node according to the phase of said clock signal, and a second port controlled by a dual port memory control element of the same processing node for exchanging data between said dual port memory element and said bus according to the phase of said clock signal; and
    wherein each said dual port memory includes a plurality of address locations which are accessible to said digital signal processing element only during a first phase of said clock signal and which are accessible to said bus only during a second, opposite phase of said clock signal, whereby conflicts between each said digital signal processing element and said bus are avoided.

2. A multiprocessor system according to claim 1 wherein each said dual port memory control element includes means of sequentially addressing each said address location and means for decoding said unique identification code and for outputting an output enable signal based thereon, said output enable signal determining whether the data of each sequentially addressed address location is available to said bus.

3. A multiprocessor system according to claim 2 wherein each said dual port memory control element further includes means for selecting the total number of said plurality of processing nodes.

4. A multiprocessor system according to claim 1 wherein said bus is thirty-two bits wide and provides 256 signals per cycle of said clock signal.

5. A multiprocessor system according to claim 1 wherein each said dual port memory control elements comprises 512 address locations, each holding 32 bits of data.

6. A multiprocessor system according to claim 1 or 5 wherein each said dual port memory element is subdivided into quarter segments, a first two of which are accessible for read operations by the digital signal processor of the same node and for write operations by the bus, and a second two of which are accessible for write operations by the digital signal processor of the same node and for read operations by the bus.

7. A multiprocessor system according to claim 1 wherein each of said processing nodes includes an integrated structure comprising at least two of said digital processing element, said dual port memory element and said dual port memory control element.

8. A multiprocessor system according to claim 7 wherein each said digital processing element, said dual port memory element and said dual port memory control element are combined in an integrated structure.

9. A multiprocessor system according to claim 7 wherein each processing node includes a digital signal processing element and a plurality of dual port memory elements, each said plurality of dual port memory elements being controlled by a corresponding number of dual port memory control elements.

10. A multiprocessor system according to claim 9 wherein each said plurality of dual port memory elements for each said digital signal processing element is operatively coupled to a corresponding number of time division multiplexed buses, whereby a synchronous, multidimensional multiprocessor system is formed.

11. A multiprocessor system according to claim 3, wherein said means for selecting determines that said total number of processing nodes is any integral power of 2.

12. A multiprocessor system comprising:
    a time division multiplexed bus for transferring digital data at intervals determined by a clock signal, and a plurality of processing nodes operatively connected to each other with said bus to form a synchronous network, each of said processing nodes including a digital signal processing element, a read/write dual port memory element and a dual port memory control element;

wherein each said dual port memory control element further includes means for selecting the total number of said plurality of processing nodes;

wherein said means for selecting determines that said total number of processing nodes is any integral power of 2;

wherein each said dual port memory element has a first port for exchanging data with a corresponding digital signal processing element of the same processing node according to the phase of said clock signal, and a second port controlled by a dual port memory control element of the same processing node for exchanging data between said dual port memory element and said bus according to the phase of said clock signal; and wherein each said dual port memory includes a plurality of address locations which are accessible to said digital signal processing element only during a first phase of said clock signal and which are accessible to said bus only during a second, opposite phase of said clock signal, whereby conflicts between each said digital signal processing element and said bus are avoided.

13. A multiprocessor system according to claim 1, wherein each of said digital signal processing element, said read/write dual port memory element and said dual port memory control element in each node has a separate connection to said bus.

* * * * *